US010395664B2

(12) United States Patent
Tsingos et al.

(10) Patent No.: US 10,395,664 B2
(45) Date of Patent: Aug. 27, 2019

(54) ADAPTIVE QUANTIZATION

(71) Applicant: Dolby Laboratories Licensing Corporation, San Francisco, CA (US)

(72) Inventors: Nicolas R. Tsingos, San Francisco, CA (US); Zachary Gideon Cohen, San Francisco, CA (US); Vivek Kumar, San Bruno, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 16/072,168

(22) PCT Filed: Jan. 26, 2017

(86) PCT No.: PCT/US2017/015113
§ 371 (c)(1),
(2) Date: Jul. 23, 2018

(87) PCT Pub. No.: WO2017/132366
PCT Pub. Date: Aug. 3, 2017

(65) Prior Publication Data
US 2019/0027157 A1 Jan. 24, 2019

Related U.S. Application Data

(60) Provisional application No. 62/287,348, filed on Jan. 26, 2016.

(30) Foreign Application Priority Data

Jan. 26, 2016 (EP) ..................................... 16152783

(51) Int. Cl.
*G10L 19/032* (2013.01)
*G10L 19/20* (2013.01)
(Continued)

(52) U.S. Cl.
CPC ............ *G10L 19/032* (2013.01); *G10L 19/00* (2013.01); *G10L 19/002* (2013.01); *G10L 19/20* (2013.01); *H03M 1/00* (2013.01)

(58) Field of Classification Search
CPC ............................. G10L 19/032; G10L 19/20
See application file for complete search history.

(56) References Cited

U.S. PATENT DOCUMENTS 6,006,179 A   12/1999  Wu
6,487,535 B1  11/2002  Smyth
(Continued)

FOREIGN PATENT DOCUMENTS

CN    1461112    12/2003
CN    1477872    2/2004
(Continued)

OTHER PUBLICATIONS

Bosi, M. et al "ISO/IEC MPEG-2 Advanced Audio Coding" Journal of the Audio Engineering Society, Oct. 1997, vol. 45, No. 10, pp. 789-814.
(Continued)

*Primary Examiner* — Douglas Godbold

(57) ABSTRACT

An importance metric, based at least in part on an energy metric, may be determined for each of a plurality of received audio objects. Some methods may involve: determining a global importance metric for all of the audio objects, based, at least in part, on a total energy value calculated by summing the energy metric of each of the audio objects; determining an estimated quantization bit depth and a quantization error for each of the audio objects; calculating a total noise metric for all of the audio objects, the total noise metric being based, at least in part, on a total quantization error corresponding with the estimated quantization bit depth; calculating a total signal-to-noise ratio corresponding with the total noise metric and the total energy value; and
(Continued)

determining a final quantization bit depth for each of the audio objects by applying a signal-to-noise ratio threshold to the total signal-to-noise ratio.

13 Claims, 9 Drawing Sheets

(51) Int. Cl.
*G10L 19/002* (2013.01)
*G10L 19/00* (2013.01)
*H03M 1/00* (2006.01)

(56) References Cited

U.S. PATENT DOCUMENTS

| | | |
|---|---|---|
| 6,664,913 B1 | 12/2003 | Craven |
| 6,678,647 B1 | 1/2004 | Edler |
| 6,680,972 B1 | 1/2004 | Liljeryd |
| 7,536,299 B2 | 5/2009 | Cheng |
| 7,660,424 B2 | 2/2010 | Davis |
| 7,813,932 B2 | 10/2010 | Kim |
| 8,065,139 B2 | 11/2011 | Kot |
| 8,249,883 B2 | 8/2012 | Mehrotra |
| 8,374,858 B2 | 2/2013 | Fejzo |
| 8,428,957 B2 | 4/2013 | Garudadri |
| 8,442,836 B2 | 5/2013 | Li |
| 8,589,155 B2 | 11/2013 | Zavarehei |
| 8,909,361 B2 | 12/2014 | Kong |
| 9,105,271 B2 | 8/2015 | Mehrotra |
| 9,185,418 B2 | 11/2015 | Regunathan |
| 2006/0004566 A1 | 1/2006 | Eunmi |
| 2007/0156397 A1* | 7/2007 | Chong ............... G10L 19/032 704/229 |
| 2010/0324912 A1* | 12/2010 | Choo ................ G10L 19/20 704/500 |
| 2011/0106546 A1 | 5/2011 | Fejzo |
| 2012/0143613 A1* | 6/2012 | Herre ................ G10L 19/008 704/500 |
| 2013/0216070 A1 | 8/2013 | Keiler |
| 2014/0025386 A1 | 1/2014 | Xiang |
| 2014/0126725 A1 | 5/2014 | Disch |
| 2015/0154969 A1 | 6/2015 | Craven |
| 2015/0279378 A1 | 10/2015 | Craven |
| 2015/0317985 A1 | 11/2015 | Biswas |
| 2015/0332680 A1* | 11/2015 | Crockett ............ G10L 19/008 381/23 |
| 2015/0340044 A1* | 11/2015 | Kim ................... G10L 19/002 381/23 |

FOREIGN PATENT DOCUMENTS

| | | |
|---|---|---|
| CN | 101312042 | 11/2008 |
| CN | 101499282 | 8/2009 |
| CN | 101950562 | 1/2011 |
| CN | 102081926 | 6/2011 |
| CN | 102571518 | 1/2015 |
| JP | 2012-133366 | 7/2012 |
| WO | 1994/003988 | 2/1994 |
| WO | 2014/161994 | 10/2014 |
| WO | 2014/161996 | 10/2014 |
| WO | 2014/165543 | 10/2014 |
| WO | 2015/150746 | 10/2015 |

OTHER PUBLICATIONS

Kanade, J. B. et al, "A literature survey on psychoacoustic models and wavelets in audio compression", pub Jan. 2014, Int. Journal of Advanced Research in Electronic and Comm. Engineering (IJARECE), vol. 3, No. 1, pp. 1-7.

Painter, T. et al "A review of algorithms for perceptual coding of digital audio signals"., Pub Jan. 2014, Located via Google Scholar, Digital Signal Processing Proc., vol. 1, pp. 179-180.

Wang, J. et al "Context-based adaptive arithmetic coding in time and frequency domain for the lossless compression of audio coding parameters at variable rate"., pub Dec. 2013., located via Google Scholar., EURASIP Journal on Audio, Speech, and Music Processing, 2013:9, pp. 1-13.

Zhao, L. et al "Fast intra-encoding algorithm for high efficiency video coding"., located via Google Scholar., Signal Processing: Image Communication, vol. 29, No. 9, pp. 935-944.

Craven, P. et al "Lossless coding for audio discs"., pub Sep. 1996, located via Google Scholar, Journal of Audio Engineering Society (JAES), vol. 44, No. 9, pp. 706-720.

Schuller, G.D.T."Perceptual Audio Coding Using Adaptive Pre- and Post-Filters and Lossless Compression" IEEE Transactions on Speech and Audio Processing, vol. 10, No. 6, Sep. 2002.

Painter, T. et al "Perceptual coding of digital audio"., pub Apr. 2000, located via Google Scholar, Proc. of the IEEE, vol. 88, No. 4, pp. 451-515.

Herre, Jurgen "Temporal noise shaping, quantization and coding methods in perceptual audio coding: A tutorial introduction"., pub Aug. 1999, located via Google Scholar, Journal of Audio Engineering Society, 17th Int. Conf., High Quality Audio Coding, pp. 1-14.

Pulkki, Ville "Compensating Displacement of Amplitude-Panned Virtual Sources" Audio Engineering Society, 22nd International Conference, Synthetic and Entertainment Audio, pp. 186-195, Espoo, Finland, 2002.

* cited by examiner

ADAPTIVE QUANTIZATION

CROSS-REFERENCE TO RELATED APPLICATIONS

This application claims the benefit of priority to U.S. Provisional Patent Application No. 62/287,348 filed 26 Jan. 2016 and European Patent Application No. 16152783.3 filed 26 Jan. 2016, which are hereby incorporated by reference.

TECHNICAL FIELD

This disclosure relates to audio data processing. In particular, this disclosure relates to the efficient coding of audio data.

BACKGROUND

Since the introduction of sound with film in 1927, there has been a steady evolution of technology used to capture the artistic intent of the motion picture sound track and to replay it in a cinema environment. In the 1930s, synchronized sound on disc gave way to variable area sound on film, which was further improved in the 1940s with theatrical acoustic considerations and improved loudspeaker design, along with early introduction of multi-track recording and steerable replay (using control tones to move sounds). In the 1950s and 1960s, magnetic striping of film allowed multichannel playback in theatre, introducing surround channels and up to five screen channels in premium theatres.

In the 1970s Dolby introduced noise reduction, both in post-production and on film, along with a cost-effective means of encoding and distributing mixes with 3 screen channels and a mono surround channel. The quality of cinema sound was further improved in the 1980s with Dolby Spectral Recording (SR) noise reduction and certification programs such as THX. Dolby brought digital sound to the cinema during the 1990s with a 5.1 channel format that provides discrete left, center and right screen channels, left and right surround arrays and a subwoofer channel for low-frequency effects. Dolby Surround 7.1, introduced in 2010, increased the number of surround channels by splitting the existing left and right surround channels into four "zones."

As the number of channels increases and the loudspeaker layout transitions from a planar two-dimensional (2D) array to a three-dimensional (3D) array including height speakers, the tasks of authoring and rendering sounds are becoming increasingly complex. In some instances, the increased complexity has involved a commensurate increase in the amount of audio data that needs to be stored and/or streamed. Improved methods and devices would be desirable.

SUMMARY

Some aspects of the subject matter described in this disclosure involve audio data that includes audio objects created without reference to any particular reproduction environment. As used herein, the term "audio object" may refer to a stream of audio signals and associated audio object metadata. The metadata may indicate at least the position of the audio object. However, in some examples the metadata also may indicate decorrelation data, rendering constraint data, content type data (e.g. dialog, effects, etc.), gain data, trajectory data, etc. Some audio objects may be static, whereas others may have time-varying metadata: such audio objects may move, may change size and/or may have other properties that change over time.

When audio objects are monitored or played back in a reproduction environment, the audio objects may be rendered according to at least the audio object position data. The rendering process may involve computing a set of audio object gain values for each channel of a set of output channels. Each output channel may correspond to one or more reproduction speakers of the reproduction environment. Accordingly, the rendering process may involve rendering the audio objects into one or more speaker feed signals based, at least in part, on audio object metadata. The speaker feed signals may correspond to reproduction speaker locations within the reproduction environment.

As described in detail herein, in some implementations a method may involve receiving audio data that includes a plurality of audio objects. The audio objects may include audio signals and associated audio object metadata. In some examples, the plurality of audio objects may correspond to a single frame of audio data. An importance metric, which may be based at least in part on an energy metric, may be determined for each of the audio objects. In some implementations, the energy metric may be a perceptual energy metric that corresponds to human hearing sensitivity as a function of frequency. Some examples may involve sorting the audio objects according to the energy metric of each audio object.

Some methods may involve determining a global importance metric for all of the audio objects, based, at least in part, on a total energy value calculated by summing the energy metric of each of the audio objects Such methods may involve determining an estimated quantization bit depth and a quantization error for each of the audio objects. Some such methods may involve calculating a total noise metric for all of the audio objects. According to some implementations, the total noise metric may be based, at least in part, on a total quantization error corresponding with the estimated quantization bit depth. Alternatively, or additionally, the total noise metric may be based, at least in part, on a perceptual noise metric that corresponds to human hearing sensitivity as a function of frequency. Some implementations may involve calculating a total signal-to-noise ratio corresponding with the total noise metric and the total energy value and determining a final quantization bit depth for each of the audio objects by determining whether the total signal-to-noise ratio is less than or equal to a signal-to noise ratio threshold, and, if it is determined that the total signal-to-noise ratio exceeds the signal-to-noise ratio threshold, the following steps are performed iteratively until it is determined that the total signal-to-noise ratio is less than or equal to the signal-to-noise ratio threshold: identifying an audio object corresponding with a greatest quantization error, increasing a bit depth for quantizing the audio object corresponding with the greatest quantization error; recalculating the total noise metric; and recalculating the total signal-to-noise ratio.

The method may involve quantizing the audio signals corresponding to each of the audio objects according to the final quantization bit depths. Some such examples may involve outputting quantized audio signals to a lossless encoder.

Some such methods may involve: estimating, for each of the audio objects, an audio object quantization error corresponding to each of a plurality of quantization bit depths; calculating a total quantization error, for all of the audio objects, corresponding to each of the plurality of quantization bit depths; and storing, at least temporarily, estimated audio object quantization errors and calculated total quantization errors.

In some examples, determining the estimated quantization bit depth may involve determining an energy ratio of each audio object's energy metric to the total energy value and determining the estimated quantization bit depth for each audio object according to the energy ratio.

In some implementations, the importance metric may be based, at least in part, on the audio object metadata. For example, the metadata may include audio object position data and the importance metric may be based, at least in part, on the audio object position data. According to some implementations, the metadata may include audio object priority data and the importance metric may be based, at least in part, on the audio object priority data.

Some methods may involve dithering the audio signals. The total noise metric may include dithering noise.

At least some of the audio objects may be static audio objects. However, at least some of the audio objects may be dynamic audio objects that have time-varying metadata, such as time-varying position data.

Some or all of the methods described herein may be performed by one or more devices according to instructions (e.g., software) stored on non-transitory media. Such non-transitory media may include memory devices such as those described herein, including but not limited to random access memory (RAM) devices, read-only memory (ROM) devices, etc. For example, the software may include instructions for controlling one or more devices for receiving audio data including one or more audio objects. The audio objects may include audio signals and associated audio object metadata.

The software may include instructions for receiving audio data that includes a plurality of audio objects. The audio objects may include audio signals and associated audio object metadata. In some examples, the plurality of audio objects may correspond to a single frame of audio data. An importance metric, which may be based at least in part on an energy metric, may be determined for each of the audio objects. In some implementations, the energy metric may be a perceptual energy metric that corresponds to human hearing sensitivity as a function of frequency. Some examples may involve sorting the audio objects according to the energy metric of each audio object.

The software may include instructions for: determining a global importance metric for all of the audio objects, based, at least in part, on a total energy value calculated by summing the energy metric of each of the audio objects; determining an estimated quantization bit depth and a quantization error for each of the audio objects; calculating a total noise metric for all of the audio objects, the total noise metric being based, at least in part, on a total quantization error corresponding with the estimated quantization bit depth; calculating a total signal-to-noise ratio corresponding with the total noise metric and the total energy value; and determining a final quantization bit depth for each of the audio objects by determining whether the total signal-to-noise ratio is less than or equal to a signal-to-noise ratio threshold, and, if it is determined that the total signal-to-noise ratio exceeds the signal-to-noise ratio threshold, performing the following steps iteratively until it is determined that the total signal-to-noise ratio is less than or equal to the signal-to-noise ratio threshold: identifying an audio object corresponding with a greatest quantization error; increasing a bit depth for quantizing the audio object corresponding with the greatest quantization error; recalculating the total noise metric; and recalculating the total signal-to-noise ratio.

The software may include instructions for quantizing the audio signals corresponding to each of the audio objects according to the final quantization bit depths. The software may include instructions for outputting quantized audio signals to a lossless encoder.

The software may include instructions for: estimating, for each of the audio objects, an audio object quantization error corresponding to each of a plurality of quantization bit depths; calculating a total quantization error, for all of the audio objects, corresponding to each of the plurality of quantization bit depths; and storing, at least temporarily, estimated audio object quantization errors and calculated total quantization errors.

In some examples, determining the estimated quantization bit depth may involve determining an energy ratio of each audio object's energy metric to the total energy value and determining the estimated quantization bit depth for each audio object according to the energy ratio.

In some implementations, the importance metric may be based, at least in part, on the audio object metadata. For example, the metadata may include audio object position data and the importance metric may be based, at least in part, on the audio object position data.

The software may include instructions for dithering the audio signals. The total noise metric may include dithering noise.

At least some aspects of this disclosure may be implemented in an apparatus that includes an interface system and a control system. The control system may include at least one of a general purpose single- or multi-chip processor, a digital signal processor (DSP), an application specific integrated circuit (ASIC), a field programmable gate array (FPGA) or other programmable logic device, discrete gate or transistor logic, or discrete hardware components. The interface system may include a network interface. In some implementations, the apparatus may include a memory system. The interface system may include an interface between the control system and at least a portion of (e.g., at least one memory device of) the memory system.

The control system may be configured to receive, via the interface system, audio data that includes audio objects. The audio objects may include audio signals and associated audio object metadata.

The control system may be configured to: determine a global importance metric for all of the audio objects, based, at least in part, on a total energy value calculated by summing the energy metric of each of the audio objects; determine an estimated quantization bit depth and a quantization error for each of the audio objects; calculate a total noise metric for all of the audio objects, the total noise metric being based, at least in part, on a total quantization error corresponding with the estimated quantization bit depth; calculate a total signal-to-noise ratio corresponding with the total noise metric and the total energy value; and to determine a final quantization bit depth for each of the audio objects by determining whether the total signal-to-noise ratio is less than or equal to a signal-to-noise ratio threshold, and, if it is determined that the total signal-to-noise ratio exceeds the signal-to-noise ratio threshold, performing the following steps iteratively until it is determined that the total signal-to-noise ratio is less than or equal to the signal-to-noise ratio threshold: identifying an audio object corresponding with a greatest quantization error; increasing a bit depth for quantizing the audio object corresponding with the greatest quantization error; recalculating the total noise metric; and recalculating the total signal-to-noise ratio.

The control system may be configured to quantize the audio signals corresponding to each of the audio objects according to the final quantization bit depths. The control system may be configured to output quantized audio signals to a lossless encoder.

The control system may be configured to: estimate, for each of the audio objects, an audio object quantization error corresponding to each of a plurality of quantization bit depths; calculating a total quantization error, for all of the audio objects, corresponding to each of the plurality of quantization bit depths; and storing, at least temporarily, estimated audio object quantization errors and calculated total quantization errors.

In some examples, determining the estimated quantization bit depth may involve determining an energy ratio of each audio object's energy metric to the total energy value and determining the estimated quantization bit depth for each audio object according to the energy ratio.

In some implementations, the importance metric may be based, at least in part, on the audio object metadata. For example, the metadata may include audio object position data and the importance metric may be based, at least in part, on the audio object position data.

The control system may be configured to dither the audio signals. The total noise metric may include dithering noise.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DESCRIPTION OF EXAMPLE EMBODIMENTS

The following description is directed to certain implementations for the purposes of describing some innovative aspects of this disclosure, as well as examples of contexts in which these innovative aspects may be implemented. However, the teachings herein can be applied in various different ways. For example, while various implementations have been described in terms of particular reproduction environments, the teachings herein are widely applicable to other known reproduction environments, as well as reproduction environments that may be introduced in the future. Moreover, the described implementations may be implemented in various authoring and/or rendering tools, which may be implemented in a variety of hardware, software, firmware, etc. Accordingly, the teachings of this disclosure are not intended to be limited to the implementations shown in the figures and/or described herein, but instead have wide applicability.

Figure 1:
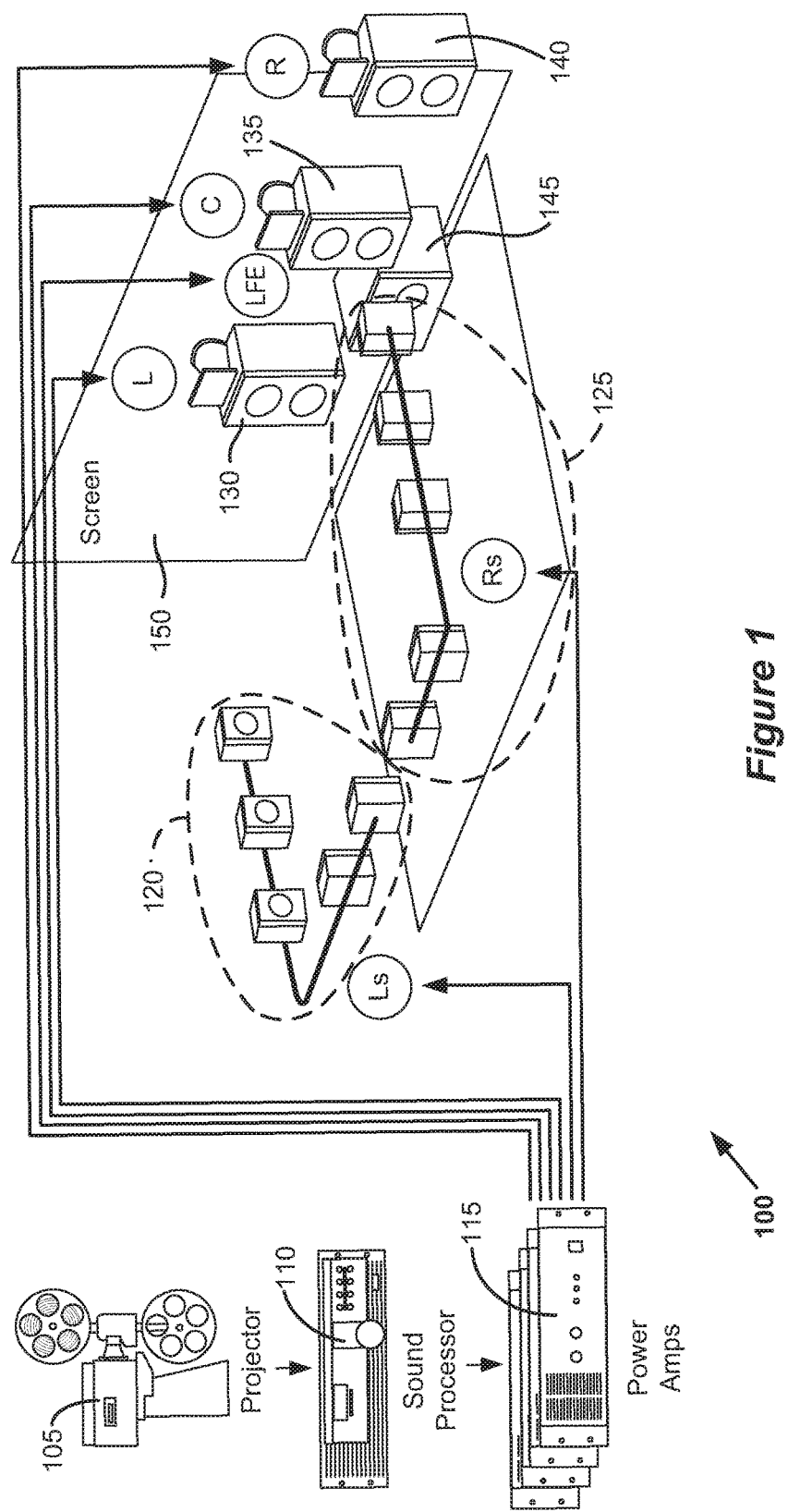
FIG. 1 shows an example of a reproduction environment having a Dolby Surround 5.1 configuration.

FIG. 1 shows an example of a reproduction environment having a Dolby Surround 5.1 configuration. Dolby Surround 5.1 was developed in the 1990s, but this configuration is still widely deployed in cinema sound system environments. A projector 105 may be configured to project video images, e.g. for a movie, on the screen 150. Audio reproduction data may be synchronized with the video images and processed by the sound processor 110. The power amplifiers 115 may provide speaker feed signals to speakers of the reproduction environment 100.

The Dolby Surround 5.1 configuration includes left surround array 120 and right surround array 125, each of which includes a group of speakers that are gang-driven by a single channel. The Dolby Surround 5.1 configuration also includes separate channels for the left screen channel 130, the center screen channel 135 and the right screen channel 140. A separate channel for the subwoofer 145 is provided for low-frequency effects (LFE).

Figure 2:
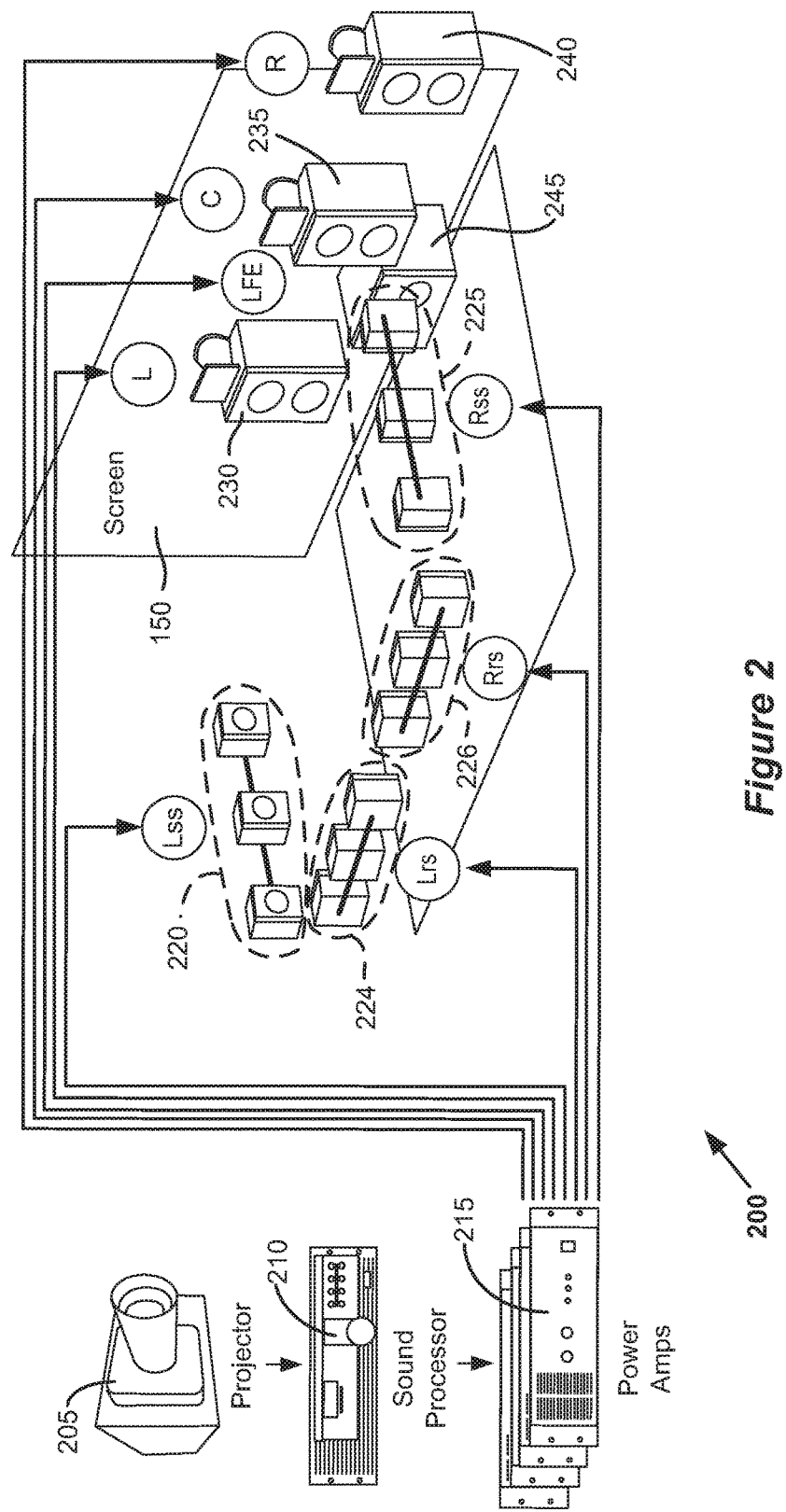
FIG. 2 shows an example of a reproduction environment having a Dolby Surround 7.1 configuration.

In 2010, Dolby provided enhancements to digital cinema sound by introducing Dolby Surround 7.1. FIG. 2 shows an example of a reproduction environment having a Dolby Surround 7.1 configuration. A digital projector 205 may be configured to receive digital video data and to project video images on the screen 150. Audio reproduction data may be processed by the sound processor 210. The power amplifiers 215 may provide speaker feed signals to speakers of the reproduction environment 200.

The Dolby Surround 7.1 configuration includes the left side surround array 220 and the right side surround array 225, each of which may be driven by a single channel Like Dolby Surround 5.1, the Dolby Surround 7.1 configuration includes separate channels for the left screen channel 230, the center screen channel 235, the right screen channel 240 and the subwoofer 245. However, Dolby Surround 7.1 increases the number of surround channels by splitting the left and right surround channels of Dolby Surround 5.1 into four zones: in addition to the left side surround array 220 and the right side surround array 225, separate channels are included for the left rear surround speakers 224 and the right rear surround speakers 226. Increasing the number of surround zones within the reproduction environment 200 can significantly improve the localization of sound.

In an effort to create a more immersive environment, some reproduction environments may be configured with increased numbers of speakers, driven by increased numbers of channels. Moreover, some reproduction environments may include speakers deployed at various elevations, some of which may be above a seating area of the reproduction environment.

Figure 3A:
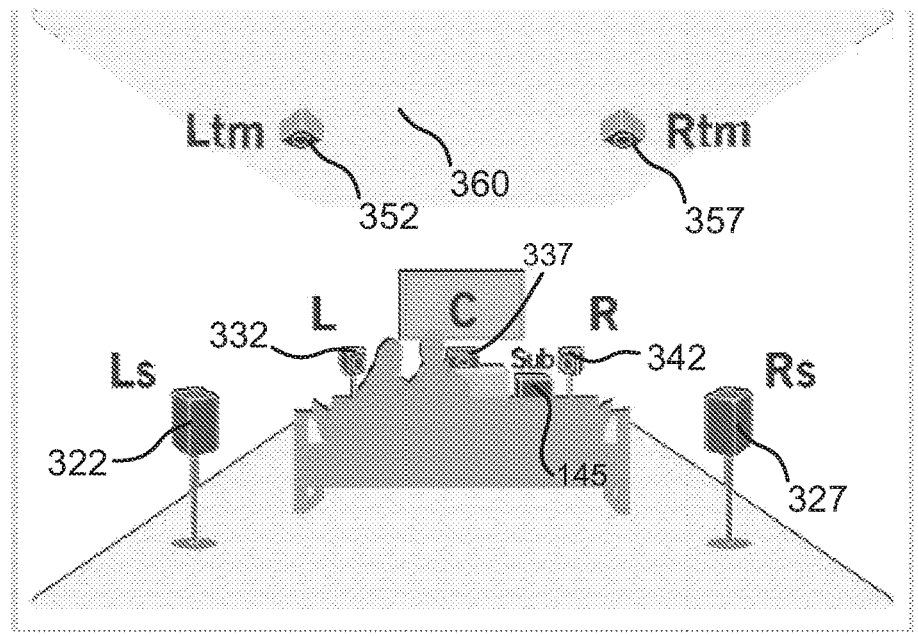
FIGS. 3A and 3B illustrate two examples of home theater playback environments that include height speaker configurations.
Figure 3B:
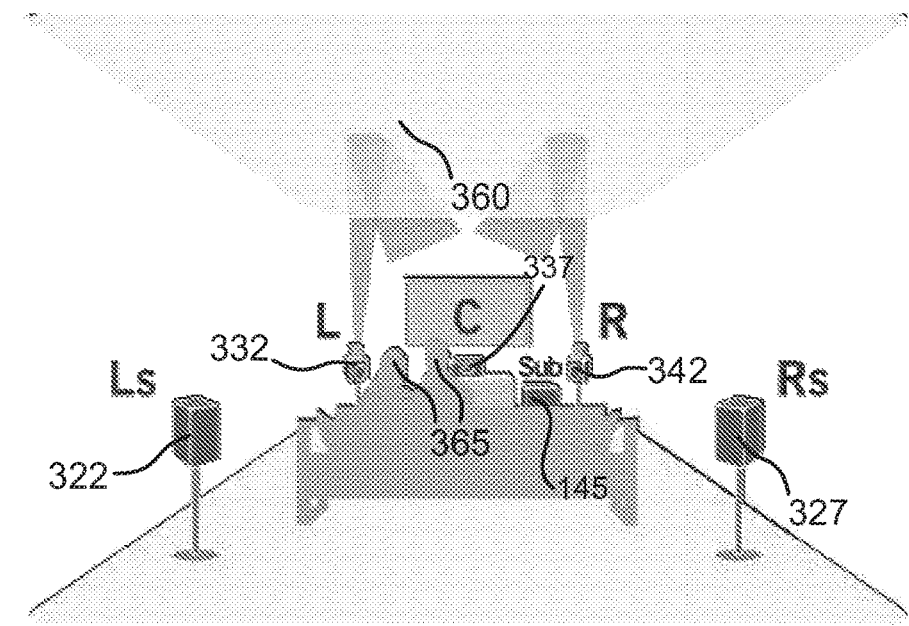

FIGS. 3A and 3B illustrate two examples of home theater playback environments that include height speaker configurations. In these examples, the playback environments 300a and 300b include the main features of a Dolby Surround 5.1 configuration, including a left surround speaker 322, a right surround speaker 327, a left speaker 332, a right speaker 342, a center speaker 337 and a subwoofer 145. However, the playback environment 300 includes an extension of the Dolby Surround 5.1 configuration for height speakers, which may be referred to as a Dolby Surround 5.1.2 configuration.

FIG. 3A illustrates an example of a playback environment having height speakers mounted on a ceiling 360 of a home theater playback environment. In this example, the playback environment 300a includes a height speaker 352 that is in a left top middle (Ltm) position and a height speaker 357 that is in a right top middle (Rtm) position. In the example shown in FIG. 3B, the left speaker 332 and the right speaker 342 are Dolby Elevation speakers that are configured to reflect sound from the ceiling 360. If properly configured, the reflected sound may be perceived by listeners 365 as if the sound source originated from the ceiling 360. However, the number and configuration of speakers is merely provided by way of example. Some current home theater implementations provide for up to 34 speaker positions, and contemplated home theater implementations may allow yet more speaker positions.

Accordingly, the modern trend is to include not only more speakers and more channels, but also to include speakers at differing heights. As the number of channels increases and the speaker layout transitions from a 2D array to a 3D array, the tasks of positioning and rendering sounds becomes increasingly difficult. Accordingly, the present assignee has developed various tools, as well as related user interfaces, which increase functionality and/or reduce authoring complexity for a 3D audio sound system.

Figure 4A:
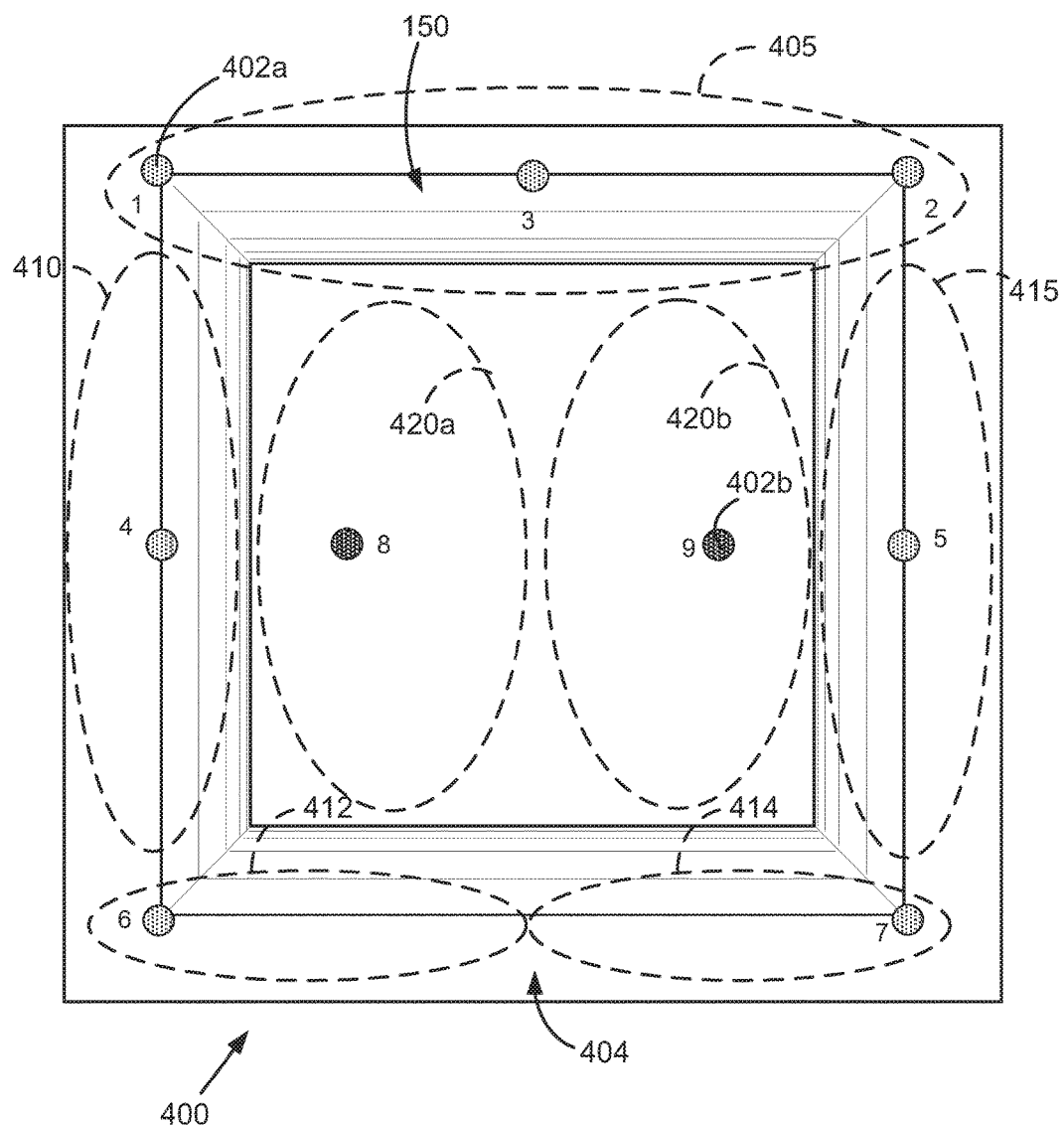
FIG. 4A shows an example of a graphical user interface (GUI) that portrays speaker zones at varying elevations in a virtual reproduction environment.

FIG. 4A shows an example of a graphical user interface (GUI) that portrays speaker zones at varying elevations in a virtual reproduction environment. GUI 400 may, for example, be displayed on a display device according to instructions from a control system, according to signals received from user input devices, etc.

As used herein with reference to virtual reproduction environments such as the virtual reproduction environment 404, the term "speaker zone" generally refers to a logical construct that may or may not have a one-to-one correspondence with a reproduction speaker of an actual reproduction environment. For example, a "speaker zone location" may or may not correspond to a particular reproduction speaker location of a cinema reproduction environment. Instead, the term "speaker zone location" may refer generally to a zone of a virtual reproduction environment. In some implementations, a speaker zone of a virtual reproduction environment may correspond to a virtual speaker, e.g., via the use of virtualizing technology such as Dolby Headphone,™ (sometimes referred to as Mobile Surround™), which creates a virtual surround sound environment in real time using a set of two-channel stereo headphones. In GUI 400, there are seven speaker zones 402a at a first elevation and two speaker zones 402b at a second elevation, making a total of nine speaker zones in the virtual reproduction environment 404. In this example, speaker zones 1-3 are in the front area 405 of the virtual reproduction environment 404. The front area 405 may correspond, for example, to an area of a cinema reproduction environment in which a screen 150 is located, to an area of a home in which a television screen is located, etc.

Here, speaker zone 4 corresponds generally to speakers in the left area 410 and speaker zone 5 corresponds to speakers in the right area 415 of the virtual reproduction environment 404. Speaker zone 6 corresponds to a left rear area 412 and speaker zone 7 corresponds to a right rear area 414 of the virtual reproduction environment 404. Speaker zone 8 corresponds to speakers in an upper area 420a and speaker zone 9 corresponds to speakers in an upper area 420b, which may be a virtual ceiling area. Accordingly, the locations of speaker zones 1-9 that are shown in FIG. 4A may or may not correspond to the locations of reproduction speakers of an actual reproduction environment. Moreover, other implementations may include more or fewer speaker zones and/or elevations.

In various implementations, a user interface such as GUI 400 may be used as part of an authoring tool and/or a rendering tool. In some implementations, the authoring tool and/or rendering tool may be implemented via software stored on one or more non-transitory media. The authoring tool and/or rendering tool may be implemented (at least in part) by hardware, firmware, etc. In some authoring implementations, an associated authoring tool may be used to create metadata for associated audio data. The metadata may, for example, include data indicating the position and/or trajectory of an audio object in a three-dimensional space, speaker zone constraint data, etc. The metadata may be created with respect to the speaker zones 402 of the virtual reproduction environment 404, rather than with respect to a particular speaker layout of an actual reproduction environment. A rendering tool may receive audio data and associated metadata, and may compute audio gains and speaker feed signals for a reproduction environment. Such audio gains and speaker feed signals may be computed according to an amplitude panning process, which can create a perception that a sound is coming from a position P in the reproduction environment. For example, speaker feed signals may be provided to reproduction speakers 1 through N of the reproduction environment according to the following equation:

$$x_i(t)=g_i x(t), i=1, \ldots N \quad \text{(Equation 1)}$$

In Equation 1, $x_i(t)$ represents the speaker feed signal to be applied to speaker i, $g_i$ represents the gain factor of the corresponding channel, x(t) represents the audio signal and t represents time. The gain factors may be determined, for example, according to the amplitude panning methods described in Section 2, pages 3-4 of V. Pulkki, *Compensating Displacement of Amplitude-Panned Virtual Sources* (Audio Engineering Society (AES) International Conference on Virtual, Synthetic and Entertainment Audio), which is hereby incorporated by reference. In some implementations, the gains may be frequency dependent. In some implementations, a time delay may be introduced by replacing x(t) by x(t-Δt).

In some rendering implementations, audio reproduction data created with reference to the speaker zones 402 may be mapped to speaker locations of a wide range of reproduction environments, which may be in a Dolby Surround 5.1 configuration, a Dolby Surround 7.1 configuration, a Hamasaki 22.2 configuration, or another configuration. For example, referring to FIG. 2, a rendering tool may map audio reproduction data for speaker zones 4 and 5 to the left side surround array 220 and the right side surround array 225 of a reproduction environment having a Dolby Surround 7.1 configuration. Audio reproduction data for speaker zones 1, 2 and 3 may be mapped to the left screen channel 230, the right screen channel 240 and the center screen channel 235, respectively. Audio reproduction data for speaker zones 6 and 7 may be mapped to the left rear surround speakers 224 and the right rear surround speakers 226.

Figure 4B:
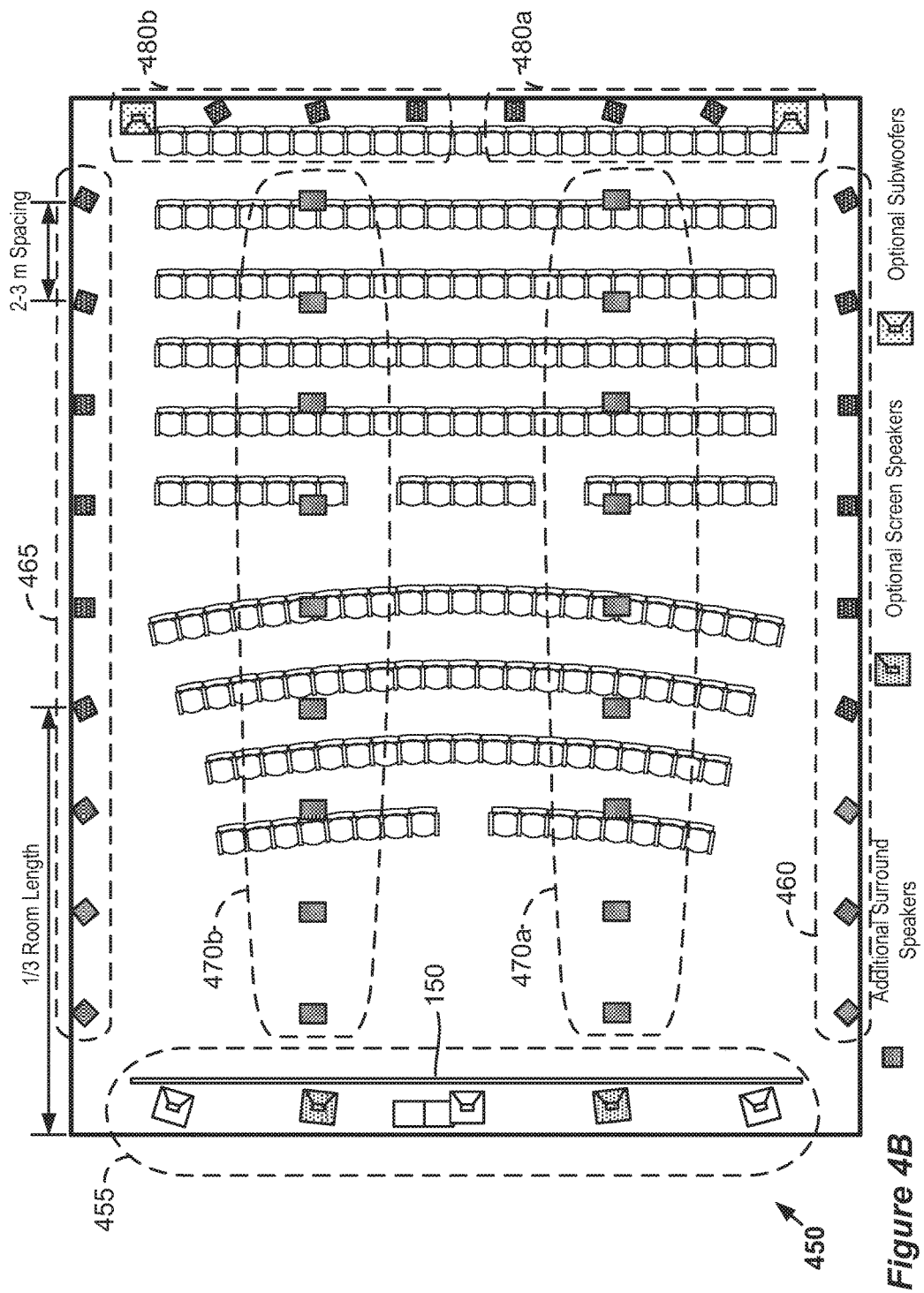
FIG. 4B shows an example of another reproduction environment.

FIG. 4B shows an example of another reproduction environment. In some implementations, a rendering tool may map audio reproduction data for speaker zones 1, 2 and 3 to corresponding screen speakers 455 of the reproduction environment 450. A rendering tool may map audio reproduction data for speaker zones 4 and 5 to the left side surround array 460 and the right side surround array 465 and may map audio reproduction data for speaker zones 8 and 9 to left overhead speakers 470a and right overhead speakers 470b. Audio reproduction data for speaker zones 6 and 7 may be mapped to left rear surround speakers 480a and right rear surround speakers 480b.

In some authoring implementations, an authoring tool may be used to create metadata for audio objects. As noted above, the term "audio object" may refer to a stream of audio data signals and associated metadata. The metadata may indicate one or more of the position of the audio object, the apparent size of the audio object, rendering constraints as well as content type (e.g. dialog, effects), etc. Depending on the implementation, the metadata may include other types of data, such as gain data, trajectory data, etc. Some audio objects may be static, whereas others may move. Audio object details may be authored or rendered according to the associated metadata which, among other things, may indicate the position of the audio object in a two-dimensional space or a three-dimensional space at a given point in time. When audio objects are monitored or played back in a reproduction environment, the audio objects may be rendered according to their position metadata and possibly other metadata, such as size metadata, according to the reproduction speaker layout of the reproduction environment.

In view of the foregoing advantages, movie studios and other content creators are often providing audio data that includes audio objects. For example, many content creators are using a lossless audio codec, such as Dolby TrueHD™, for encoding audio data that includes audio objects, along with video content, on optical discs for home theater playback environments. Such audio data may also be provided via download to an audio/video receiver (AVR) of a home theater system.

In some instances, there may be limits to the amount of audio data that can be recorded on a storage medium, such as an optical disc, along with video content and/or limits to the amount of audio data that can streamed along with video content. A limit on the amount of audio data that can be recorded on a storage medium or a limit on the amount of audio data that can streamed may, in some instances, place a limit on the number of audio objects that can be encoded for concurrent playback in a home theater system. Some audio codecs include features, such as noise shaping, which may further limit bitrates when enabled. Enabling such features may potentially increase the number of audio objects that can be encoded for concurrent playback. Some existing versions of such audio codecs provide for noise shaping, but with a fixed number of bits.

Accordingly, it would be desirable to encode audio data, including but not limited to audio data that includes audio objects, more efficiently. Some implementations disclosed herein allocate bits for audio encoding on a time-dependent basis. Some disclosed methods involve an adaptive quantization process that can vary the allocation of bits for quantization on a frame by frame, per-audio object basis. According to some examples, an adaptive quantization process may vary the allocation of bits for quantization based, at least in part, on an importance metric. In some such examples, an estimated quantization bit depth for each of a plurality of audio objects may be based, at least in part, on the importance metric. The importance metric may be based, at least in part, on an energy metric. In some examples, the energy metric may be a perceptual energy metric that corresponds to human hearing sensitivity as a function of frequency.

Some implementations may involve iteratively minimizing the quantization error such that a signal-to-noise ratio is always at or above a predetermined threshold. According to some such implementations, a final quantization bit depth for each of the audio objects may be determined by applying a signal-to-noise ratio threshold to a total signal-to-noise ratio that is determined according to the estimated quantization bit depth. In some examples, audio data may be quantized according to the final quantization bit depth for each of the audio objects. The quantized audio data may, in some examples, be input to an encoder that functions according to a lossless codec, such as the Dolby TrueHD™ codec, the Apple Lossless Audio Codec, the Windows Media Lossless Codec, MPEG-4 Audio Lossless Coding, etc.

Figure 5:
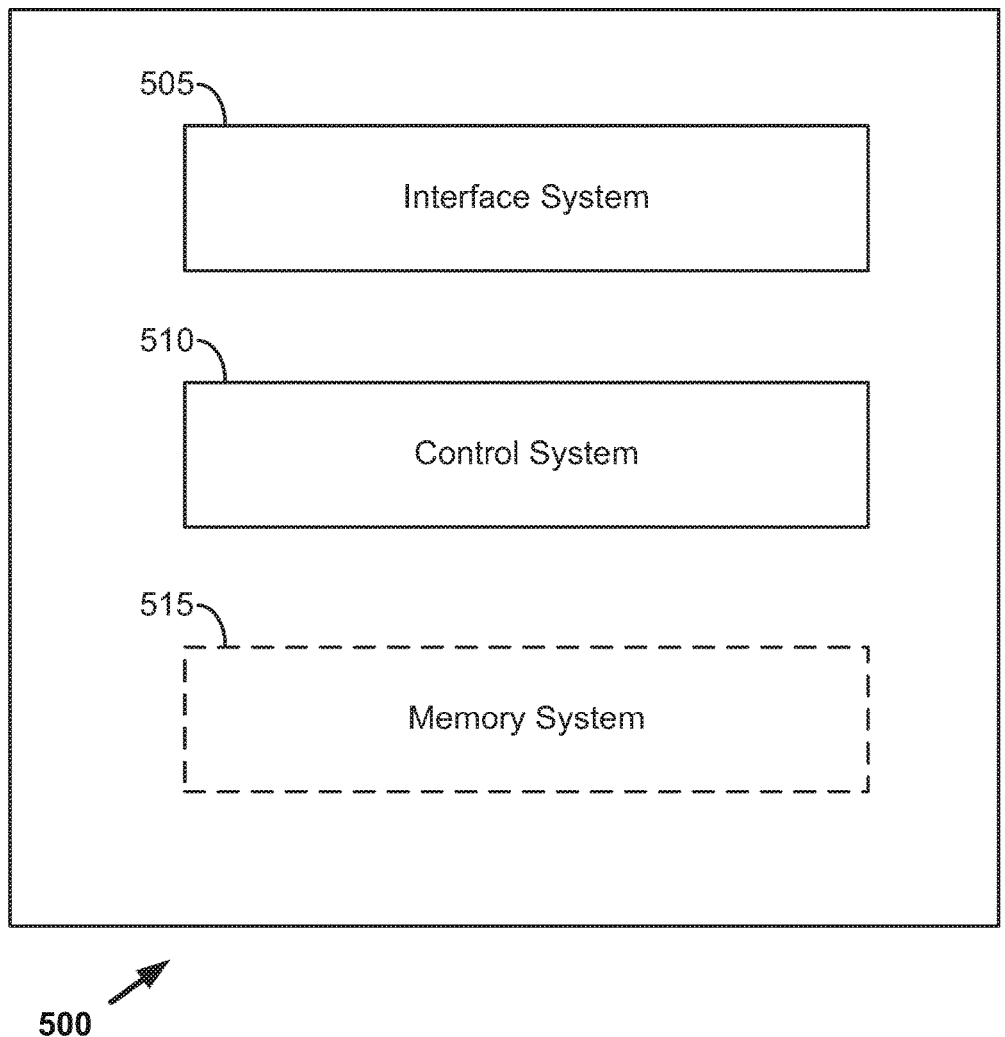
FIG. 5 is a block diagram that provides examples of components of an apparatus capable of implementing various methods described herein.

FIG. 5 is a block diagram that provides examples of components of an apparatus capable of implementing various methods described herein. The apparatus 500 may, for example, be (or may be a portion of) an audio encoding system. In some examples, the apparatus 500 may be implemented in a component of another device.

In this example, the apparatus 500 includes an interface system 505 and a control system 510. The control system 510 may be capable of implementing some or all of the methods disclosed herein. The control system 510 may, for example, include a general purpose single- or multi-chip processor, a digital signal processor (DSP), an application specific integrated circuit (ASIC), a field programmable gate array (FPGA) or other programmable logic device, discrete gate or transistor logic, and/or discrete hardware components.

In this implementation, the apparatus 500 includes a memory system 515. The memory system 515 may include one or more suitable types of non-transitory storage media, such as flash memory, a hard drive, etc. The interface system 505 may include a network interface, an interface between the control system and the memory system and/or an external device interface (such as a universal serial bus (USB) interface). Although the memory system 515 is depicted as a separate element in FIG. 5, the control system 510 may include at least some memory, which may be regarded as a portion of the memory system. Similarly, in some implementations the memory system 515 may be capable of providing some control system functionality.

In this example, the control system 510 is capable of receiving audio data and other information via the interface system 505. In some implementations, the control system 510 may include (or may implement), an audio encoding apparatus.

In some implementations, the control system 510 may be capable of performing at least some of the methods described herein according to software stored one or more non-transitory media. The non-transitory media may include memory associated with the control system 510, such as random access memory (RAM) and/or read-only memory (ROM). The non-transitory media may include memory of the memory system 515.

Figure 6:
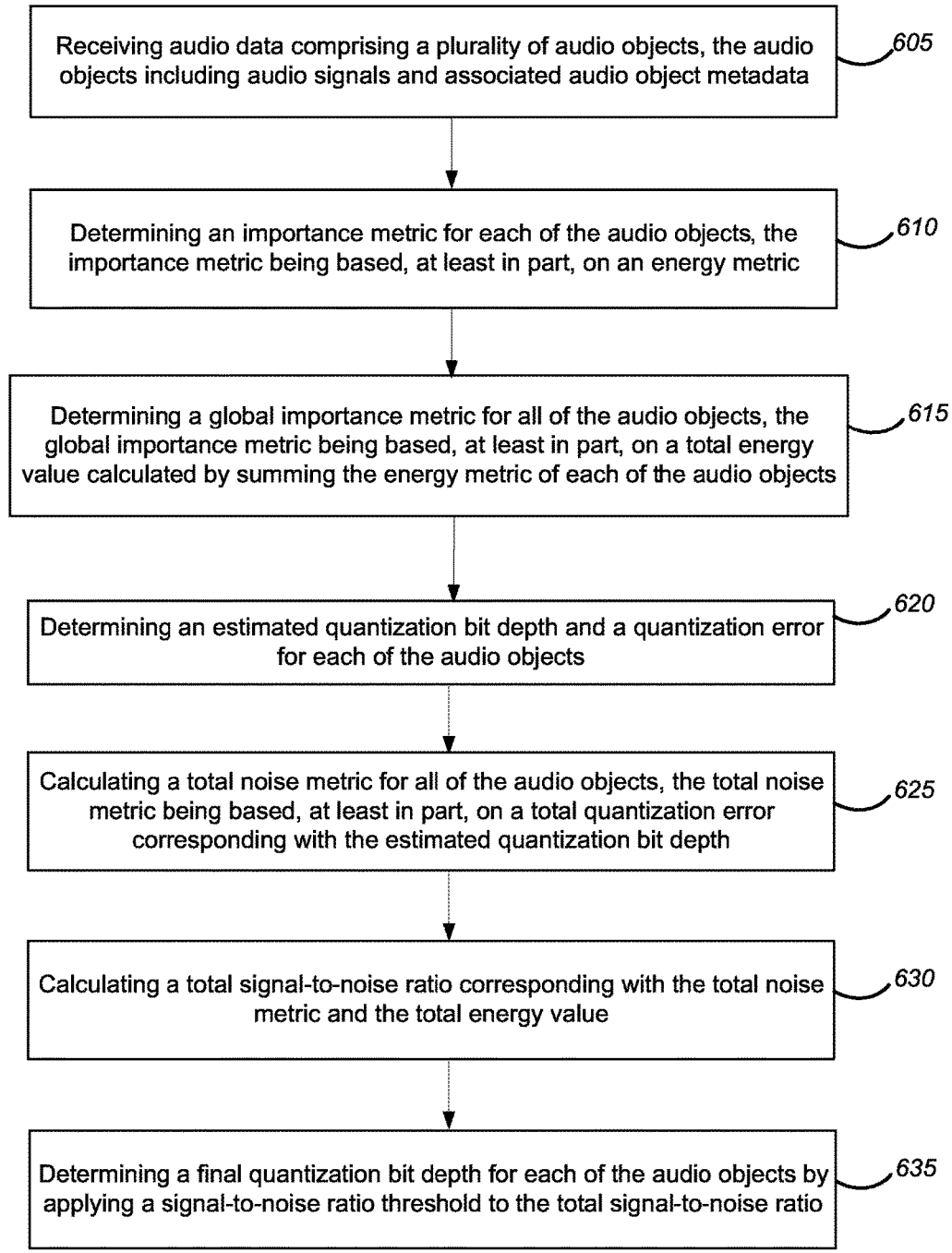
FIG. 6 is a flow diagram that shows example blocks of an adaptive quantization process according to some implementations.

FIG. 6 is a flow diagram that shows example blocks of an adaptive quantization process according to some implementations. The blocks of FIG. 6 (and those of other flow diagrams provided herein) may, for example, be performed by the control system 510 of FIG. 5 or by a similar apparatus. Accordingly, some blocks of FIG. 6 are described below with reference to one or more elements of FIG. 5. As with other methods disclosed herein, the method outlined in FIG. 6 may include more or fewer blocks than indicated. Moreover, the blocks of methods disclosed herein are not necessarily performed in the order indicated.

Here, block 605 involves receiving audio data that includes a plurality of audio objects. In this example, the audio objects include audio signals and associated audio object metadata. In some examples, the plurality of audio objects may correspond to a single frame of audio data. Block 605 may involve receiving the audio data via an interface system, such as the interface system 605 of FIG. 5.

In this example, block 610 involves determining an importance metric for each of the audio objects. According to this implementation, the importance metric is based, at least in part, on an energy metric. In some such implementations, the energy metric may be a perceptual energy metric that corresponds to human hearing sensitivity as a function of frequency. In some examples, the perceptual energy metric may correspond with one of the many known sets of equal-loudness contours for human hearing, such as Fletcher-Munson curves.

In some examples, determining the energy metric may involve applying a frequency-weighting filter to the signal corresponding to each audio object. Some such examples may involve weighting the energy in multiple frequency subbands according to the energy of the weighting filter in each frequency subband. The frequency weighting filter may be, or may be similar to, the A-weighting curve defined by the International Electrotechnical Commission (IEC) standard IEC 61672:2003 or the A-weighting curve defined by the International Organization for Standardization (ISO) 226:2003. According to some examples, the energy metric may be the square of the result after applying an A-weighting filter to the energy or gain corresponding to each audio object. Some examples may involve sorting the audio objects according to the energy metric of each audio object.

In some implementations, the importance metric may be based, at least in part, on the audio object metadata. For example, the metadata may include audio object position data and the importance metric may be based, at least in part, on the audio object position data. This positional data could be used to leverage spatial masking to further quantize the audio object signals. For example, audio objects which are relatively close in position could be deemed less important than objects which are isolated from other audio objects in space, which would be deemed more important. Audio objects that are relatively closer together will act as relatively more efficient maskers for introduced quantization noise.

According to this example, block 615 involves determining a global importance metric for all of the audio objects. In this implementation, the global importance metric is based, at least in part, on a total energy value that includes the energy of all of the audio objects. Accordingly, in this example block 615 involves calculating a total energy value by summing the energy metric of each of the audio objects.

According to this implementation, block 620 follows block 615. However, in some alternative implementations, block 620 may be performed only if one or more conditions are met. According to some such implementations, a control system may be capable of determining whether the total energy value is non-zero. The control system may perform subsequent operations of method 600 (such as determining the estimated quantization bit depth, calculating the total noise metric and calculating the total signal-to-noise ratio) only if the total energy value is non-zero. If the total energy value is zero, or is below a threshold energy value, the control system may assign a predetermined bit depth to the audio object(s).

In this implementation, block 620 involves determining an estimated quantization bit depth and a quantization error for each of the audio objects. According to some such implementations, block 620 may involve determining the estimated quantization bit depth for an audio object according to the proportion of energy that the audio object contributes to the total energy value. For example, the proportion of energy that the audio object contributes to the total energy value according to the following equation:

$$\text{Prop}_n = E_n / E_{Total} \quad \text{(Equation 2)}$$

In Equation 2, $E_{Total}$ represents the total energy value that is determined in block 615, $E_n$ represents the energy metric of audio object "n" and $\text{Prop}_n$ represents the proportion of energy that the audio object "n" contributes to the total energy value. According to some such examples, block 620 involves mapping $\text{Prop}_n$ to a corresponding bit depth. For example, block 620 may involve mapping the lowest-energy audio objects to a low-energy bit depth, intermediate-energy objects to one or more intermediate-energy bit depths and the highest energy objects to a high-energy bit depth. In some such examples, the low-energy bit depth may be 20 bits, an intermediate-energy bit depth may be 16 bits and the high-energy bit depth may be 12 bits. However, these are merely illustrative examples. In one alternative implementation, the low-energy bit depth is 24 bits, intermediate-energy bit depths are 20 bits and 16 bits, and the high-energy bit depth is 12 bits. In another alternative implementation, the low-energy bit depth is 20 bits, intermediate-energy bit depths are 16 bits and 12 bits, and the high-energy bit depth is 8 bits.

Similarly, the threshold energy values for mapping $\text{Prop}_n$ to a corresponding bit depth may vary according to the particular implementation. In some such examples, a low-energy bit depth may be assigned to an audio object having less than 0.1% of the total energy, an intermediate-energy bit depth may be assigned to an audio object having less than 6% of the total energy and a high-energy bit depth may be assigned to an audio object having 6% or more of the total energy. In other examples, a low-energy bit depth may be assigned to an audio object having less than 0.1% of the total energy, a first intermediate-energy bit depth may be assigned to an audio object having less than 1% of the total energy, a second intermediate-energy bit depth may be assigned to an audio object having less than 10% of the total energy and a high-energy bit depth may be assigned to an audio object having 10% or more of the total energy. Other implementations may include more or fewer bit depths, different bit values for each bit depth, different threshold energy values for bit depths, etc.

According to this example, block 620 also involves determining a quantization error, corresponding to the estimated quantization bit depth, for each of the audio objects. Quantization error may be estimated by temporarily quantizing an audio signal and comparing the quantized audio signal to the original audio signal, e.g., via sample-by-sample subtraction. Each sample quantization error may be squared and summed to determine a quantization error energy, a single metric for determining the noise level introduced by the quantization process for each audio object. In some examples, quantization error energy may be calculated for each frame of samples. Determining the quantization error may depend not only on the estimated quantization bit depth, but also on a number of bits used to encode the received audio data. For example, if the estimated quantization bit depth for an audio object is 24 bits (which may correspond with the low-energy bit depth) and the received audio data was encoded at 24 bits, block 620 may involve determining a quantization error of zero for the audio object.

In this example, block 625 involves calculating a total noise metric for all of the audio objects. Here, the total noise metric is based, at least in part, on a total quantization error corresponding with the estimated quantization bit depth for each of the audio objects. For example, the total noise metric may be determined by summing the quantization error energy for each of the audio objects. Some implementations may involve dithering at least some of the audio signals. In such implementations, the total noise metric also may include dithering noise.

Some implementations may involve estimating, for each of the audio objects, an audio object quantization error corresponding to each of a plurality of quantization bit depths. Such implementations may involve calculating a total quantization error, for all of the audio objects, corresponding to each of the plurality of quantization bit depths. The total quantization error may be the sum of each of the audio object quantization errors. Some such implementations also may involve storing, at least temporarily, estimated audio object quantization errors and calculated total quantization errors. For example, such implementations may involve storing the estimated audio object quantization errors and calculated total quantization errors in the memory system 515 or in a memory system of the control system 510.

In the example shown in FIG. 6, block 630 involves calculating a total signal-to-noise ratio corresponding with the total noise metric and the total energy value. The total signal-to-noise ratio may, for example, be the total energy value divided by the total noise metric.

In this implementation, block 635 involves determining a final quantization bit depth for each of the audio objects by applying a signal-to-noise ratio threshold to the total signal-to-noise ratio. The signal-to-noise ratio threshold may vary according to the particular implementation. In some examples, the signal-to-noise ratio threshold may be 40 dB, 45 dB, 50 dB, 55 dB, 60 dB, etc. Such implementations may involve quantizing the audio signals corresponding to each of the audio objects according to the final quantization bit depths. Some examples may involve outputting quantized audio signals to a lossless encoder. The quantized audio data may, in some examples, be input to an encoder that functions according to a lossless codec, such as the Dolby TrueHD™ codec, the Apple Lossless Audio Codec, the Windows Media Lossless Codec, MPEG-4 Audio Lossless Coding, etc.

If the total signal-to-noise ratio corresponding with the estimated quantization bit depth for each of the audio objects is less than or equal to the signal-to-noise ratio threshold, the final quantization bit depth for each of the audio objects may be set to the estimated quantization bit depth for each of the audio objects. If not, some implementations involve an iterative process of determining the final quantization bit depths.

Figure 7:
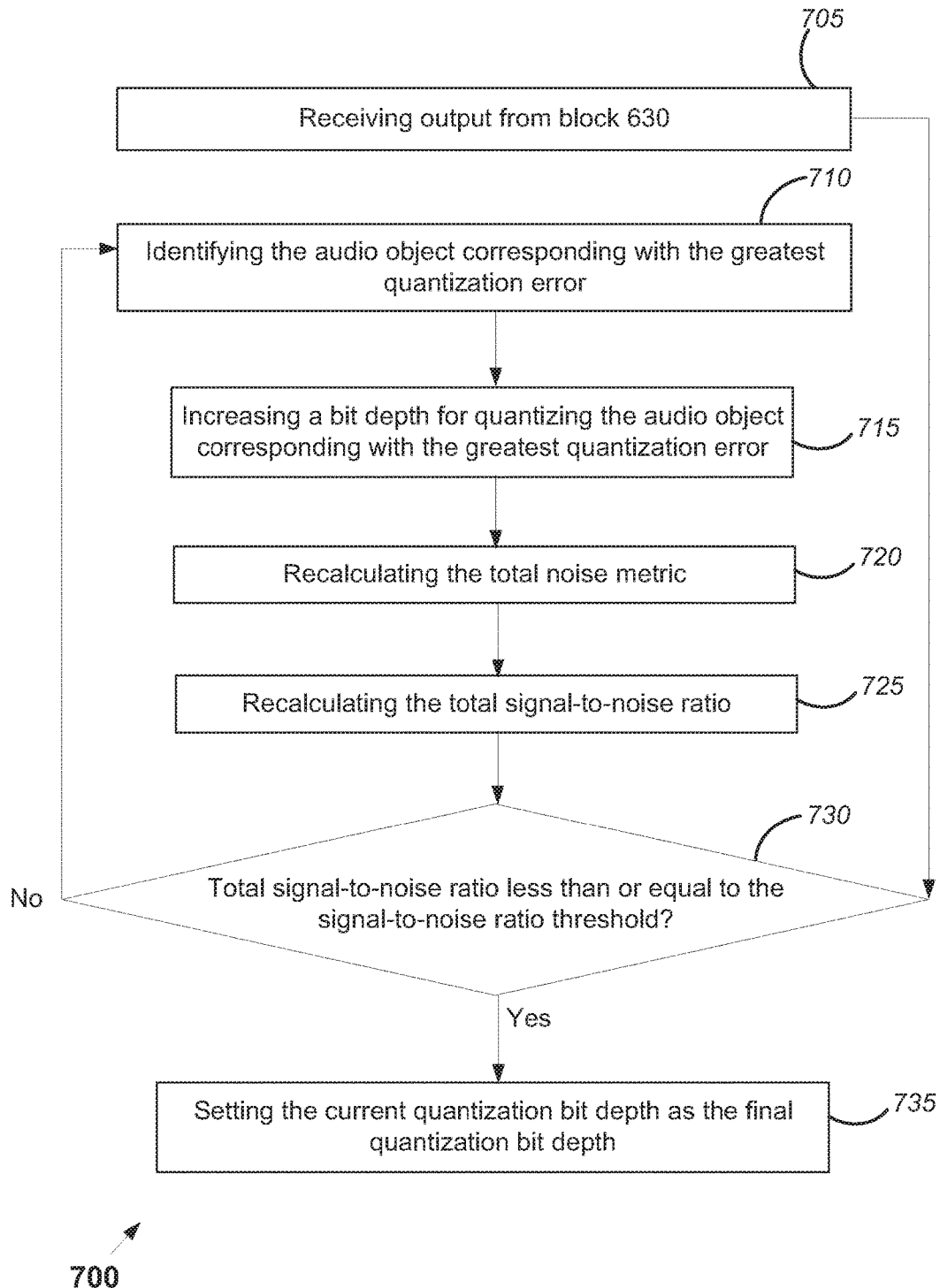
FIG. 7 is a flow diagram that shows examples of blocks of an iterative process of determining final quantization bit depths.

FIG. 7 is a flow diagram that shows examples of blocks of an iterative process of determining final quantization bit depths. Blocks 705 through 735 of FIG. 7 provide a detailed flow diagram for implementing block 635 of FIG. 6, according to one example. The blocks of FIG. 7 may, for example, be performed by the control system 510 of FIG. 5 or by a similar apparatus. As with other methods disclosed herein, the method outlined in FIG. 7 may include more or fewer blocks than indicated and the blocks of FIG. 7 are not necessarily performed in the order indicated.

In this example, the output from block 630 of method 600 is input to block 730, which involves determining whether the total signal-to-noise ratio is less than or equal to a signal-to-noise ratio threshold. If so, in this example the process continues to block 735, which involves setting the current quantization bit depth as the final quantization bit depth.

However, if it is determined in block 730 that the total signal-to-noise ratio is not less than or equal to the signal-to-noise ratio threshold, in this example the process continues to block 710, which involves identifying an audio object corresponding with a greatest quantization error. In this example, block 715 involves increasing a bit depth for quantizing the audio object corresponding with the greatest quantization error. Increasing the bit depth should reduce the quantization error for that audio object.

In this implementation, block 720 involves recalculating the total noise metric, including the reduced quantization error for the audio object identified in block 710. Here, block 725 involves recalculating the total signal-to-noise ratio and then determining, in block 730, whether the total signal-to-noise ratio is less than or equal to the signal-to-noise ratio threshold. According to this implementation, the identifying, increasing and recalculating processes are performed iteratively until it is determined in block 730 that the total signal-to-noise ratio is less than or equal to the signal-to-noise ratio threshold. The current quantization bit depth is then set to the final quantization bit depth in block 735.

Figure 8:
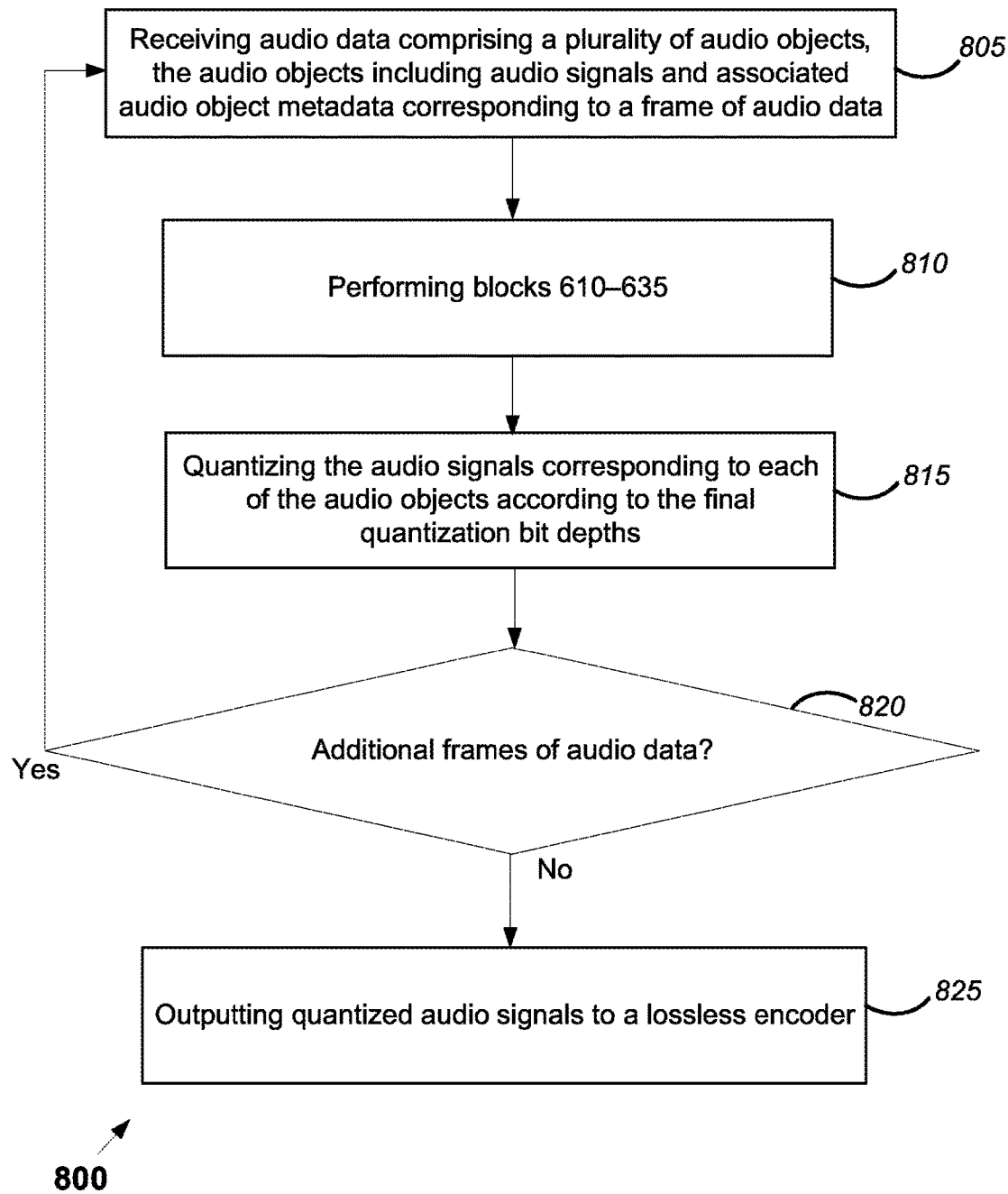
FIG. 8 is a flow diagram that shows examples of blocks of another method of adaptive quantization.

FIG. 8 is a flow diagram that shows examples of blocks of another method of adaptive quantization. The blocks of FIG. 8 may, for example, be performed by the control system 510 of FIG. 5 or by a similar apparatus. As with other methods disclosed herein, the method outlined in FIG. 8 may include more or fewer blocks than indicated and the blocks of FIG. 8 are not necessarily performed in the order indicated. For example, in some implementations block 815 may be performed after block 820.

In this example, block 805 involves receiving a frame of audio data that includes a plurality of audio objects. The audio objects include audio signals and associated audio object metadata. Here, block 810 involves performing blocks 610-635 of FIG. 6. In some implementations, determining a final quantization bit depth may involve performing blocks 705-735 of FIG. 7. In this example, block 815 involves quantizing the audio signals corresponding to each of the audio objects of the frame according to the final quantization bit depths.

According to this implementation, block 820 involves determining whether there are additional frames of audio data to be processed. If so, the method reverts to block 805. If not, in this example the quantized audio signals are output to a lossless encoder in block 825. In alternative examples, each frame may be passed directly to an encoder, which may be a lossless encoder, after block 815. In such examples, block 825 would be performed after block 815.

Various modifications to the implementations described in this disclosure may be readily apparent to those having ordinary skill in the art. The general principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Various aspects of the present invention may be appreciated from the following Enumerated example Embodiments (EEEs):

EEE 1. A method of processing audio data, the method comprising:
  receiving audio data comprising a plurality of audio objects, the audio objects including audio signals and associated audio object metadata;
  determining an importance metric for each of the audio objects, the importance metric being based, at least in part, on an energy metric;
  determining a global importance metric for all of the audio objects, the global importance metric being based, at least in part, on a total energy value calculated by summing the energy metric of each of the audio objects;
  determining an estimated quantization bit depth and a quantization error for each of the audio objects;
  calculating a total noise metric for all of the audio objects, the total noise metric being based, at least in part, on a total quantization error corresponding with the estimated quantization bit depth;
  calculating a total signal-to-noise ratio corresponding with the total noise metric and the total energy value; and
  determining a final quantization bit depth for each of the audio objects by applying a signal-to-noise ratio threshold to the total signal-to-noise ratio.

EEE 2. The method of EEE 1, wherein determining the final quantization bit depth involves:
  identifying an audio object corresponding with a greatest quantization error;
  increasing a bit depth for quantizing the audio object corresponding with the greatest quantization error;
  recalculating the total noise metric;
  recalculating the total signal-to-noise ratio; and
  determining whether the total signal-to-noise ratio is less than or equal to the signal-to-noise ratio threshold.

EEE 3. The method of EEE 2, wherein the identifying, increasing and recalculating processes are performed iteratively until it is determined that the total signal-to-noise ratio is less than or equal to the signal-to-noise ratio threshold.

EEE 4. The method of any one of EEEs 1-3, further comprising:
  estimating, for each of the audio objects, an audio object quantization error corresponding to each of a plurality of quantization bit depths;
  calculating a total quantization error, for all of the audio objects, corresponding to each of the plurality of quantization bit depths; and
  storing, at least temporarily, estimated audio object quantization errors and calculated total quantization errors.

EEE 5. The method of any one of EEEs 1-4, wherein the importance metric is based, at least in part, on the audio object metadata.

EEE 6. The method of EEE 5, wherein the audio object metadata includes audio object position data and wherein the importance metric is based, at least in part, on the audio object position data.

EEE 7. The method of any one of EEEs 1-6, further comprising dithering the audio signals, wherein the total noise metric includes dithering noise.

EEE 8. The method of any one of EEEs 1-7, wherein determining the estimated quantization bit depth involves:
  determining an energy ratio of each audio object's energy metric to the total energy value; and
  determining the estimated quantization bit depth for each audio object according to the energy ratio.

EEE 9. The method of any one of EEEs 1-8, wherein the energy metric is a perceptual energy metric that corresponds to human hearing sensitivity as a function of frequency.

EEE 10. The method of any one of EEEs 1-9, further comprising sorting the audio objects according to the energy metric of each audio object.

EEE 11. The method of any one of EEEs 1-10, wherein the plurality of audio objects corresponds to a single frame of audio data.

EEE 12. The method of any one of EEEs 1-11, further comprising quantizing the audio signals corresponding to each of the audio objects according to the final quantization bit depths.

EEE 13. The method of EEE 12, further comprising outputting quantized audio signals to a lossless encoder.

EEE 14. A non-transitory medium having software stored thereon, the software including instructions for controlling one or more devices for:
  receiving audio data comprising a plurality of audio objects, the audio objects including audio signals and associated audio object metadata;
  determining an importance metric for each of the audio objects, the importance metric being based, at least in part, on an energy metric;
  determining a global importance metric for all of the audio objects, the global importance metric being based, at least in part, on a total energy value calculated by summing the energy metric of each of the audio objects;
  determining an estimated quantization bit depth and a quantization error for each of the audio objects;
  calculating a total noise metric for all of the audio objects, the total noise metric being based, at least in part, on a total quantization error corresponding with the estimated quantization bit depth;
  calculating a total signal-to-noise ratio corresponding with the total noise metric and the total energy value; and
  determining a final quantization bit depth for each of the audio objects by applying a signal-to-noise ratio threshold to the total signal-to-noise ratio.

EEE 15. The non-transitory medium of EEE 14, wherein determining the final quantization bit depth involves:
  identifying an audio object corresponding with a greatest quantization error;
  increasing a bit depth for quantizing the audio object corresponding with the greatest quantization error;
  recalculating the total noise metric;
  recalculating the total signal-to-noise ratio; and
  determining whether the total signal-to-noise ratio is less than or equal to the signal-to-noise ratio threshold.

EEE 16. The non-transitory medium of EEE 15, wherein the software includes instructions for performing the identifying, increasing and recalculating processes iteratively until it is determined that the total signal-to-noise ratio is less than or equal to the signal-to-noise ratio threshold.

EEE 17. An apparatus, comprising:
  an interface system; and
  a control system capable of:
    receiving, via the interface system, audio data comprising a plurality of audio objects, the audio objects including audio signals and associated audio object metadata;

determining an importance metric for each of the audio objects, the importance metric being based, at least in part, on an energy metric;

determining a global importance metric for all of the audio objects, the global importance metric being based, at least in part, on a total energy value calculated by summing the energy metric of each of the audio objects;

determining an estimated quantization bit depth and a quantization error for each of the audio objects;

calculating a total noise metric for all of the audio objects, the total noise metric being based, at least in part, on a total quantization error corresponding with the estimated quantization bit depth;

calculating a total signal-to-noise ratio corresponding with the total noise metric and the total energy value;

determining a final quantization bit depth for each of the audio objects by applying a signal-to-noise ratio threshold to the total signal-to-noise ratio; and quantizing the audio signals corresponding to each of the audio objects according to the final quantization bit depths.

EEE 18. The apparatus of EEE 17, wherein determining the final quantization bit depth involves:

identifying an audio object corresponding with a greatest quantization error;

increasing a bit depth for quantizing the audio object corresponding with the greatest quantization error;

recalculating the total noise metric;

recalculating the total signal-to-noise ratio; and determining whether the total signal-to-noise ratio is less than or equal to the signal-to-noise ratio threshold.

EEE 19. The apparatus of EEE 18, wherein the control system is capable of performing the identifying, increasing and recalculating processes iteratively until the control system determines that the total signal-to-noise ratio is less than or equal to the signal-to-noise ratio threshold.

EEE 20. The apparatus of any one of EEEs 17-19, wherein the control system is capable of determining whether the total energy value is non-zero and of determining the estimated quantization bit depth, calculating the total noise metric and calculating the total signal-to-noise ratio only if the total energy value is non-zero.

EEE 21. The apparatus of any one of EEEs 17-20, wherein the control system includes at least one of a general purpose single- or multi-chip processor, a digital signal processor (DSP), an application specific integrated circuit (ASIC), a field programmable gate array (FPGA) or other programmable logic device, discrete gate or transistor logic, or discrete hardware components.

EEE 22. The apparatus of any one of EEEs 17-21, wherein the interface system includes at least one of a network interface, an interface between the control system and a memory system, an interface between the control system and another device, or an external device interface.

EEE 23. An apparatus, comprising:

an interface system; and control means for:

receiving, via the interface system, audio data comprising a plurality of audio objects, the audio objects including audio signals and associated audio object metadata;

determining an importance metric for each of the audio objects, the importance metric being based, at least in part, on an energy metric;

determining a global importance metric for all of the audio objects, the global importance metric being based, at least in part, on a total energy value calculated by summing the energy metric of each of the audio objects;

determining an estimated quantization bit depth and a quantization error for each of the audio objects;

calculating a total noise metric for all of the audio objects, the total noise metric being based, at least in part, on a total quantization error corresponding with the estimated quantization bit depth;

calculating a total signal-to-noise ratio corresponding with the total noise metric and the total energy value;

determining a final quantization bit depth for each of the audio objects by applying a signal-to-noise ratio threshold to the total signal-to-noise ratio; and quantizing the audio signals corresponding to each of the audio objects according to the final quantization bit depths.

EEE 24. The apparatus of EEE 23, wherein determining the final quantization bit depth involves:

identifying an audio object corresponding with a greatest quantization error;

increasing a bit depth for quantizing the audio object corresponding with the greatest quantization error;

recalculating the total noise metric;

recalculating the total signal-to-noise ratio; and determining whether the total signal-to-noise ratio is less than or equal to the signal-to-noise ratio threshold.

EEE 25. The apparatus of EEE 24, wherein the control means includes means for performing the identifying, increasing and recalculating processes iteratively until the control means determines that the total signal-to-noise ratio is less than or equal to the signal-to-noise ratio threshold.

What is claimed is:

1. A method of processing audio data, the method comprising:

receiving audio data comprising a plurality of audio objects, the audio objects including audio signals and associated audio object metadata;

determining an importance metric for each of the audio objects, the importance metric being based, at least in part, on an energy metric;

determining a global importance metric for all of the audio objects, the global importance metric being based, at least in part, on a total energy value calculated by summing the energy metric of each of the audio objects;

determining an estimated quantization bit depth and a quantization error for each of the audio objects;

calculating a total noise metric for all of the audio objects, the total noise metric being based, at least in part, on a total quantization error corresponding with the estimated quantization bit depth;

calculating a total signal-to-noise ratio corresponding with the total noise metric and the total energy value; and determining a final quantization bit depth for each of the audio objects by determining whether the total signal-to-noise ratio is less than or equal to a signal-to-noise ratio threshold; and if it is determined that the total signal-to-noise ratio exceeds the signal-to-noise ratio threshold, performing the following steps iteratively until it is determined that the total signal-to-noise ratio is less than or equal to the signal-to-noise ratio threshold:

identifying an audio object corresponding with a greatest quantization error;

increasing a bit depth for quantizing the audio object corresponding with the greatest quantization error;
recalculating the total noise metric; and
recalculating the total signal-to-noise ratio,
the method further comprising quantizing the audio signals corresponding to each of the audio objects according to the final quantization bit depths.

2. The method of claim 1, further comprising:
estimating, for each of the audio objects, an audio object quantization error corresponding to each of a plurality of quantization bit depths;
calculating a total quantization error, for all of the audio objects, corresponding to each of the plurality of quantization bit depths; and
storing, at least temporarily, estimated audio object quantization errors and calculated total quantization errors.

3. The method of claim 1, wherein the importance metric is based, at least in part, on the audio object metadata.

4. The method of claim 3, wherein the audio object metadata includes audio object position data and wherein the importance metric is based, at least in part, on the audio object position data.

5. The method of claim 1, further comprising dithering the audio signals, wherein the total noise metric includes dithering noise.

6. The method of claim 1, wherein determining the estimated quantization bit depth involves:
determining an energy ratio of each audio object's energy metric to the total energy value; and
determining the estimated quantization bit depth for each audio object according to the energy ratio.

7. The method of claim 1, wherein the energy metric is a perceptual energy metric that corresponds to human hearing sensitivity as a function of frequency.

8. The method of claim 1, further comprising sorting the audio objects according to the energy metric of each audio object.

9. The method of claim 1, wherein the plurality of audio objects corresponds to a single frame of audio data.

10. The method of claim 1, further comprising outputting quantized audio signals to a lossless encoder.

11. An apparatus, comprising:
an interface system; and
a control system configured to:
receive, via the interface system, audio data comprising a plurality of audio objects, the audio objects including audio signals and associated audio object metadata;
determine an importance metric for each of the audio objects, the importance metric being based, at least in part, on an energy metric;
determine a global importance metric for all of the audio objects, the global importance metric being based, at least in part, on a total energy value calculated by summing the energy metric of each of the audio objects;
determine an estimated quantization bit depth and a quantization error for each of the audio objects;
calculate a total noise metric for all of the audio objects, the total noise metric being based, at least in part, on a total quantization error corresponding with the estimated quantization bit depth;
calculate a total signal-to-noise ratio corresponding with the total noise metric and the total energy value;
determine a final quantization bit depth for each of the audio objects by:
determining whether the total signal-to-noise-ratio is less than or equal to a signal-to-noise ratio threshold; and
if it is determined that the total-signal-to-noise ratio exceeds the signal-to-noise ratio threshold, performing the following steps iteratively until it is determined that the total signal-to-noise ratio is less than or equal to the signal-to-noise ratio threshold:
identifying an audio object corresponding with a greatest quantization error;
increasing a bit depth for quantizing the audio object corresponding with the greatest quantization error;
recalculating the total noise metric; and
recalculating the total signal-to-noise ratio,
the control system further being configured to quantize the audio signals corresponding to each of the audio objects according to the final quantization bit depths.

12. The apparatus of claim 11, wherein the control system is configured to determine whether the total energy value is non-zero and of determining the estimated quantization bit depth, calculating the total noise metric and calculating the total signal-to-noise ratio only if the total energy value is non-zero.

13. A non-transitory medium having software stored thereon, the software including instructions for controlling one or more devices for:
receiving audio data comprising a plurality of audio objects, the audio objects including audio signals and associated audio object metadata;
determining an importance metric for each of the audio objects, the importance metric being based, at least in part, on an energy metric;
determining a global importance metric for all of the audio objects, the global importance metric being based, at least in part, on a total energy value calculated by summing the energy metric of each of the audio objects;
determining an estimated quantization bit depth and a quantization error for each of the audio objects;
calculating a total noise metric for all of the audio objects, the total noise metric being based, at least in part, on a total quantization error corresponding with the estimated quantization bit depth;
calculating a total signal-to-noise ratio corresponding with the total noise metric and the total energy value; and
determining a final quantization bit depth for each of the audio objects by:
determining whether the total signal-to-noise-ratio is less than or equal to a signal-to-noise ratio threshold; and
if it is determined that the total signal-to-noise ratio exceeds the signal-to-noise ratio threshold, performing the following steps iteratively until it is determined that the total signal-to-noise ratio is less than or equal to the signal-to-noise ratio threshold:
identifying an audio object corresponding with a greatest quantization error;
increasing a bit depth for quantizing the audio object corresponding with the greatest quantization error;
recalculating the total noise metric; and
recalculating the total signal-to-noise ratio,
the software further including instructions for controlling one or more devices for quantizing the audio signals corresponding to each of the audio objects according to the final quantization bit depths.

\* \* \* \* \*